United States Patent
Johnson et al.

(10) Patent No.: US 9,780,280 B2
(45) Date of Patent: Oct. 3, 2017

(54) ENERGY HARVESTING MODULE AND ILLUMINATION MEMBER FOR A VEHICLE

(71) Applicant: Nissan North America, Inc., Franklin, TN (US)

(72) Inventors: Randall Johnson, White Lake, MI (US); Nelson Phan, Rochester Hills, MI (US)

(73) Assignee: NISSAN NORTH AMERICA, INC., Franklin, TN (US)

(*) Notice: Subject to any disclaimer, the term of this patent is extended or adjusted under 35 U.S.C. 154(b) by 195 days.

(21) Appl. No.: 14/791,768

(22) Filed: Jul. 6, 2015

(65) Prior Publication Data

US 2017/0012192 A1   Jan. 12, 2017

(51) Int. Cl.
| | |
|---|---|
| *F21V 8/00* | (2006.01) |
| *H01L 35/30* | (2006.01) |
| *B60Q 1/26* | (2006.01) |
| *B60Q 1/00* | (2006.01) |

(52) U.S. Cl.
CPC ............ *H01L 35/30* (2013.01); *B60Q 1/0023* (2013.01); *B60Q 1/0094* (2013.01); *B60Q 1/2688* (2013.01); *B60Q 1/2696* (2013.01); *G02B 6/0005* (2013.01)

(58) Field of Classification Search
None
See application file for complete search history.

(56) References Cited

U.S. PATENT DOCUMENTS

| | | | |
|---|---|---|---|
| 5,508,478 A | 4/1996 | Barry | |
| 6,471,377 B1 | 10/2002 | Stegall | |
| 6,491,418 B1 | 12/2002 | Chen | |
| 6,582,108 B1 | 6/2003 | Liang | |
| 6,588,923 B1 | 7/2003 | Shih | |
| 6,623,134 B1* | 9/2003 | Chang | B60Q 1/2688 313/47 |
| 6,655,823 B2* | 12/2003 | Chang | B60Q 1/2688 362/218 |
| 6,663,269 B1* | 12/2003 | Leu | F01N 13/00 362/459 |
| 7,556,408 B2 | 7/2009 | Thomson | |
| 8,864,349 B2* | 10/2014 | Aron | B62J 6/04 362/473 |
| 9,464,776 B2* | 10/2016 | Salter | B60Q 1/2688 |
| 2006/0092621 A1 | 5/2006 | Lai | |

(Continued)

OTHER PUBLICATIONS

U.S. Appl. No. 14/482,530; Energy Harvesting Module; R Johnson; filed Sep. 10, 2014.

(Continued)

*Primary Examiner* — Britt D Hanley
(74) *Attorney, Agent, or Firm* — Global IP Counselors, LLP (57) ABSTRACT

An illumination assembly for a vehicle includes an energy harvesting module disposed on an exhaust pipe of the vehicle. The energy harvesting module includes an energy harvesting device configured to capture heat and to convert the harvested heat to electrical energy. An illumination member is electrically connected to the energy harvesting module and is configured to be illuminated by the electrical energy supplied from the energy harvesting device.

20 Claims, 5 Drawing Sheets

(56) References Cited

U.S. PATENT DOCUMENTS

| | | | | |
|---|---|---|---|---|
| 2009/0159110 A1* | 6/2009 | Kwok | ............... | F02C 6/18 |
| | | | | 136/205 |
| 2010/0186422 A1* | 7/2010 | Yang | ............... | H01L 35/30 |
| | | | | 62/3.3 |
| 2011/0126530 A1* | 6/2011 | Callahan | ............ | F01N 5/025 |
| | | | | 60/320 |
| 2011/0311421 A1* | 12/2011 | Backhaus-Ricoult | | B01D 53/9477 |
| | | | | 423/213.2 |
| 2012/0125015 A1* | 5/2012 | Renze | ............... | F25B 21/02 |
| | | | | 62/3.7 |
| 2014/0238459 A1* | 8/2014 | Moors | ............... | H01L 35/30 |
| | | | | 136/205 |
| 2014/0251579 A1* | 9/2014 | Sloss | ............... | F01N 5/02 |
| | | | | 165/96 |

OTHER PUBLICATIONS

U.S. Appl. No. 14/483,820; Battery Charging Module for a Vehicle; N Phan; filed Sep. 11, 2014.

\* cited by examiner

ENERGY HARVESTING MODULE AND ILLUMINATION MEMBER FOR A VEHICLE

BACKGROUND

Field of the Invention

The present invention generally relates to an energy harvesting module configured to supply power to an illumination member of a vehicle. More specifically, the present invention relates to an energy harvesting module disposed on an exhaust pipe of a vehicle to capture heat energy and to convert the captured heat energy to electrical energy, which is supplied to an illumination member.

Background Information

Passenger vehicles generate exhaust heat energy that is exhausted from the vehicle through the exhaust pipe of the vehicle. The generated heat energy is wasted when not captured and utilized. Accordingly, a need exists for an energy harvesting module that captures and utilizes heat energy discharged through the exhaust pipe of a vehicle to illuminate an illumination member.

SUMMARY

In view of the state of the known technology, one aspect of the present invention is to provide an illumination assembly for a vehicle including an energy harvesting module disposed on an exhaust pipe of the vehicle. The energy harvesting module includes an energy harvesting device configured to capture heat and to convert the harvested heat to electrical energy. An illumination member is electrically connected to the energy harvesting module and is configured to be illuminated by the electrical energy supplied from the energy harvesting device.

Another aspect of the present invention is to provide a method of illuminating an illumination assembly of a vehicle. Heat energy is captured with an energy harvesting device disposed on an exhaust pipe of the vehicle. The captured heat energy is converted to electrical energy with the energy harvesting module. The electrical energy is supplied to an illumination member electrically connected to the energy harvesting module to illuminate the illumination member.

BRIEF DESCRIPTION OF THE DRAWINGS

Referring now to the attached drawings which form a part of this original disclosure.

DETAILED DESCRIPTION OF EXEMPLARY EMBODIMENTS

Selected exemplary embodiments will now be explained with reference to the drawings. It will be apparent to those skilled in the art from this disclosure that the following descriptions of the exemplary embodiments are provided for illustration only and not for the purpose of limiting the invention as defined by the appended claims and their equivalents.

Figure 1:
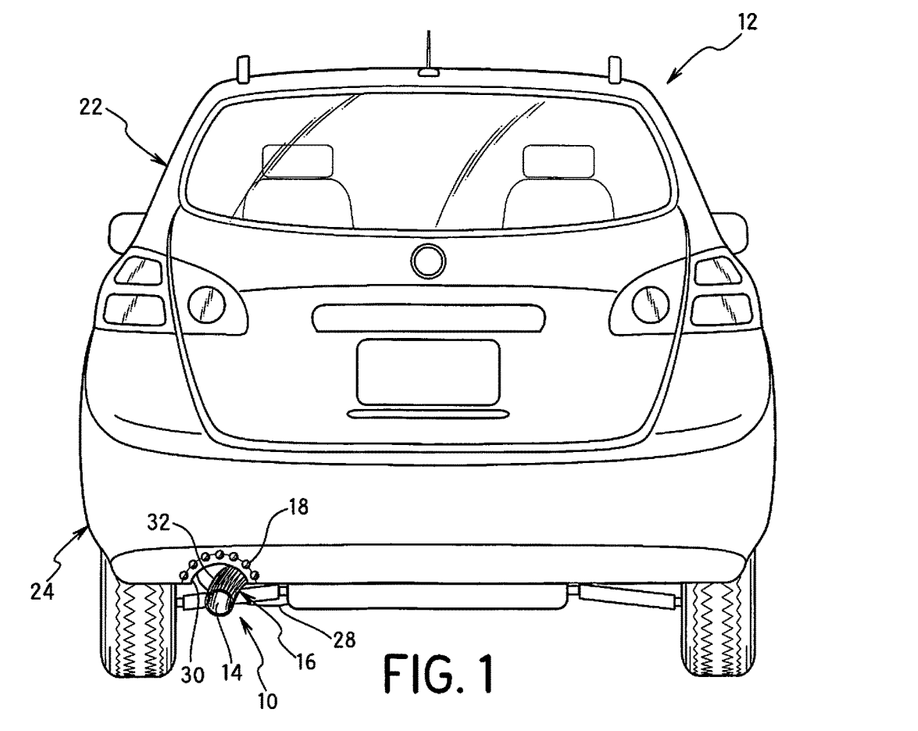
FIG. 1 is a rear view of an energy harvesting module disposed on a vehicle exhaust pipe in accordance with an exemplary embodiment of the present invention.
Figure 2:
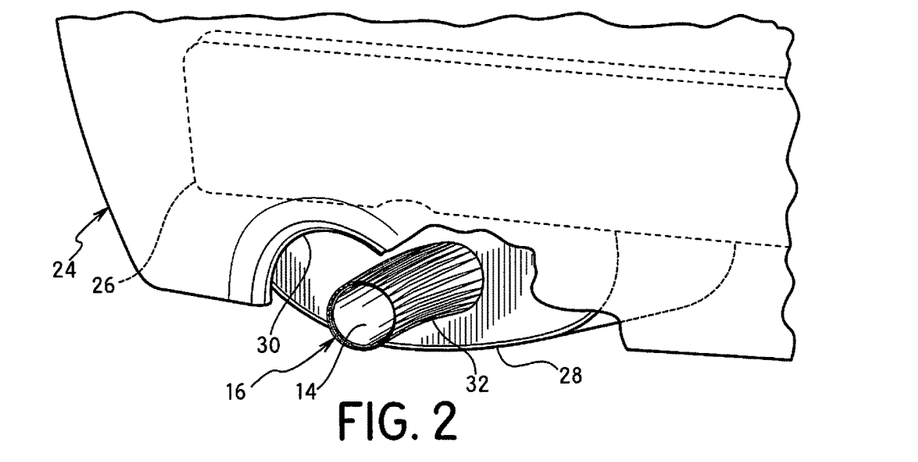
FIG. 2 is a rear perspective view of the energy harvesting module disposed on an exhaust pipe of a vehicle.

Referring initially to FIGS. 1 and 2, an illumination assembly 10 for a vehicle 12 in accordance with an exemplary embodiment of the present invention includes an exhaust pipe 14, an energy harvesting module 16 and an illumination member 18. The energy harvesting module 16 is disposed on the exhaust pipe 14 and includes an energy harvesting device 20 (FIGS. 3 and 5), which is configured to capture heat 21 (FIG. 7) discharged through the exhaust pipe 14 and to convert the harvested heat to electrical energy. The illumination member 18 is electrically connected to the energy harvesting module 16 and is configured to be illuminated by the electrical energy supplied from the energy harvesting device 20 of the energy harvesting module 16.

As shown in FIGS. 1 and 2, the vehicle 12 includes a body structure 22 including a rear bumper assembly or fascia 24 and a rear bumper support member 26 that supports the rear bumper assembly 24. The rear bumper support member 26 is supported in a conventional manner to the body structure 22 of the vehicle 12.

An exhaust system of the vehicle 12 includes a muffler 28 connected to the vehicle body structure 22. The exhaust pipe 14 is connected to the muffler 28 to discharge exhaust gases externally of the vehicle 12. An end of the exhaust pipe 14 is accommodated by a recessed portion 30 of the rear bumper assembly 24.

Figure 3:
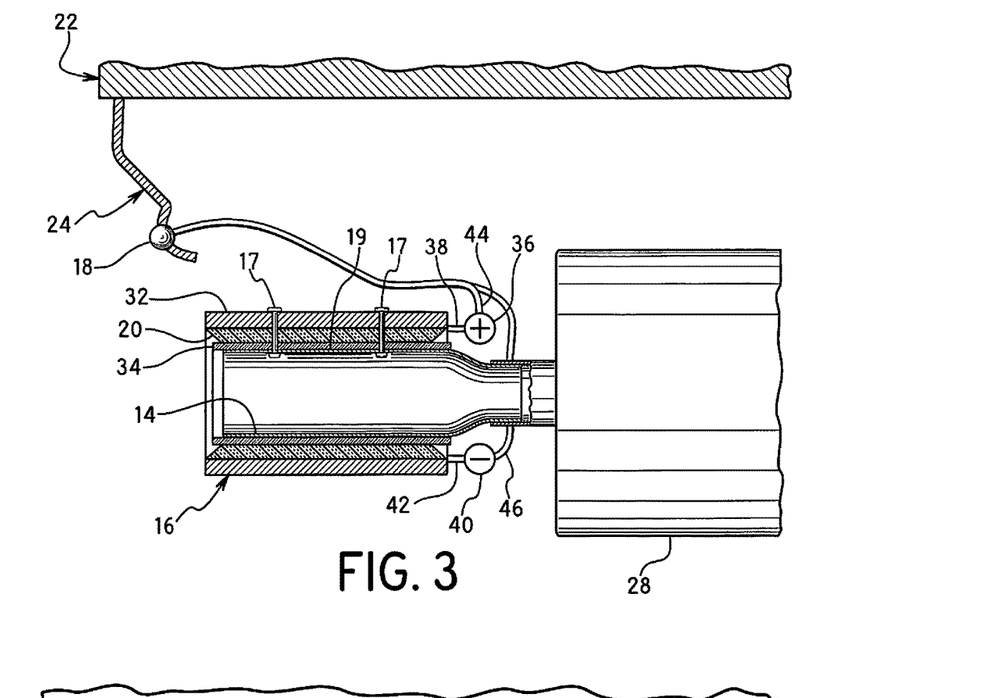
FIG. 3 is an elevational view in cross-section of an energy harvesting module disposed on an exhaust pipe and electrically connected to an illumination member mounted remotely from the energy harvesting module.
Figure 5:
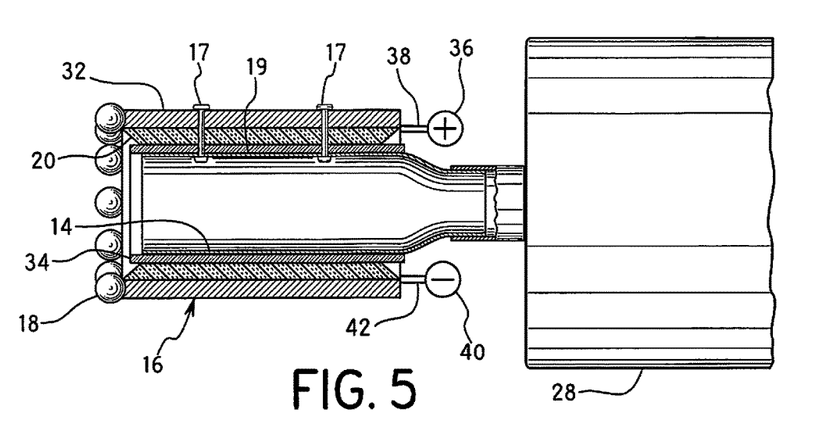
FIG. 5 is an elevational view in cross-section of an energy harvesting module disposed on an exhaust pipe and electrically connected to an illumination member mounted adjacent the energy harvesting module.

The energy harvesting module 16 includes an energy harvesting device 20, as shown in FIG. 3. The energy harvesting device 20 can be any suitable energy harvesting device configured to convert heat energy to electrical energy. The energy harvesting device 20 utilizes a thermoelectric effect, such as the Peltier, Seebeck or Thomson effect, to convert heat energy into electrical energy. The heat energy is a temperature difference, such as between the high temperature of the exhaust gas 21 (FIG. 7) discharged through the exhaust pipe 14 and the surrounding ambient air outside of the exhaust pipe 14. The energy harvesting module 16 is connected to the exhaust pipe 14 in any suitable manner, such as with mechanical fasteners 17 as shown in FIGS. 3 and 5. The energy harvesting module 16 is made of a flexible material to facilitate being disposed on the exhaust pipe 14.

The energy harvesting module 16 can include an outer cover 32 disposed on the energy harvesting device 20 to provide an aesthetic appearance to the energy harvesting module 16. The outer cover 32 can be made of any suitable material, such as stainless steel or carbon fiber. The energy harvesting module 16 can further include a heat shield 34 disposed between the outer surface 19 of the exhaust pipe 14 and the energy harvesting device 20. The heat shield 34 protects the energy harvesting device 20 from damage due to the high temperature of the exhaust gas 21 (FIG. 7) exhausted through the exhaust pipe 14.

The illumination member 18 is electrically connected to the energy harvesting device 20, as shown in FIG. 3. Any suitable illumination member 18 can be used that is configured to be illuminated when electrical energy is supplied thereto. For example, as shown in FIG. 3, the illumination member 18 can be an LED. Any suitable LED can be used, such as a clear LED, a color LED, or a combination thereof. Alternatively, the illumination member 18 can be a light pipe. The light pipe can be disposed about an entirety of a circumference of the exhaust pipe 14 as shown in FIG. 6.

The illumination member 18 is connected to any suitable location of the vehicle structure 22 in any suitable manner, such as by mechanical fasteners or an adhesive. As shown in FIGS. 1 and 3, for example, the illumination member 18 can be connected to the rear bumper assembly 24 adjacent the recessed portion 30 of the vehicle 12. Alternatively, as shown in FIGS. 5 and 6, the illumination member 18 can be disposed on the exhaust pipe 14. Preferably, the illumination member 18 is disposed at an end edge of the exhaust pipe 14, as shown in FIGS. 5 and 6, such that the illumination member 18 emits light in a rearward vehicle direction.

Figure 4:
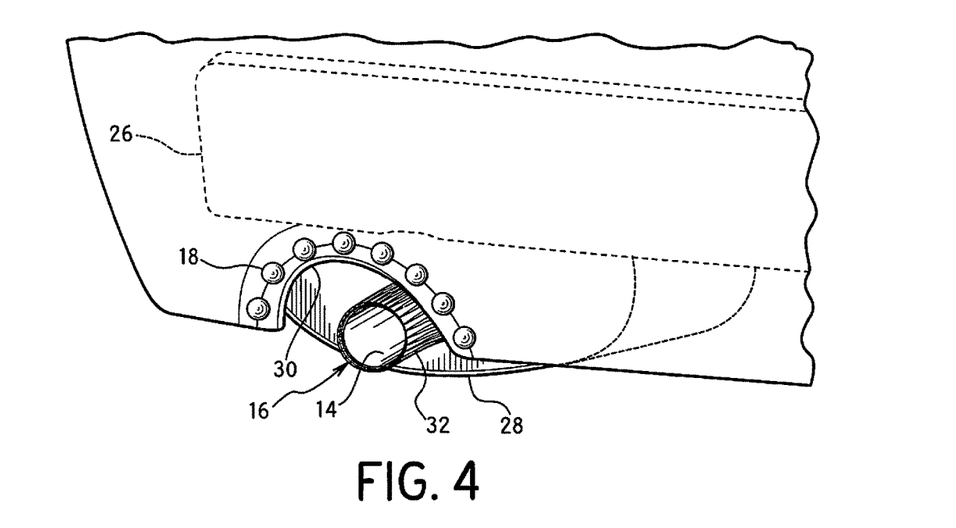
FIG. 4 is a rear perspective view of the energy harvesting module and illumination member of FIG. 3.

In the exemplary embodiment shown in FIGS. 3 and 4, the illumination member 18 is disposed on the rear bumper assembly 24 of the vehicle 12 spaced from the energy harvesting module 16. A positive terminal 36 is electrically connected by a first conductive member 38 to the energy harvesting module 16 and a negative terminal 40 is electrically connected by a second conductive member 42 to the energy harvesting module 16. Electrical wires 44 and 46 electrically connect the positive and negative terminals 36 and 40 to the illumination member 18 to supply electrical energy to the illumination member 18 spaced from the energy harvesting module 16.

Figure 6:
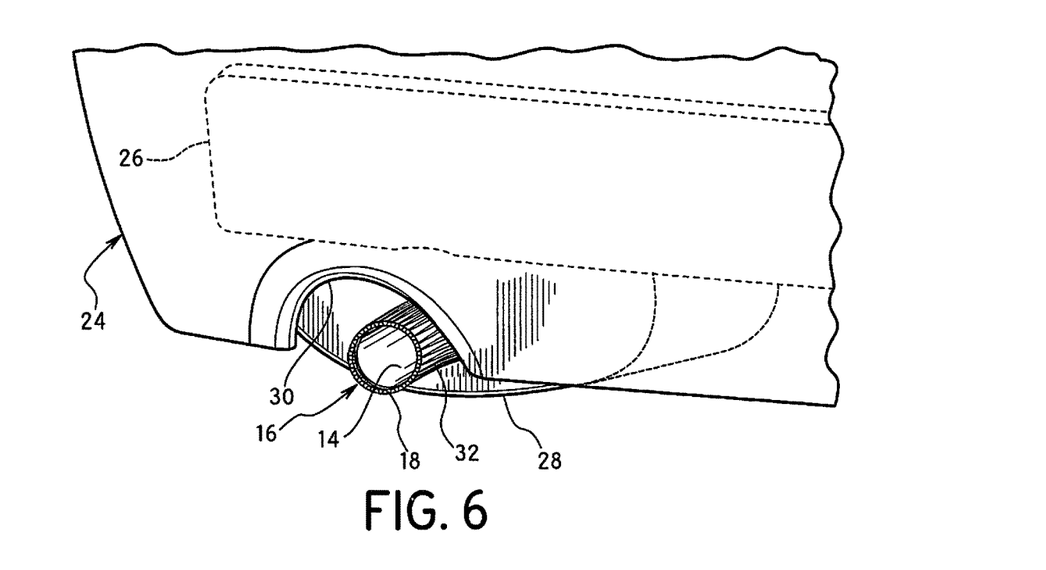
FIG. 6 is a rear perspective view of the illumination member disposed about a circumference of the exhaust pipe.

In the exemplary embodiment shown in FIGS. 5 and 6, the illumination member 18 is disposed on the exhaust pipe 14 of the vehicle. The illumination member 18 is electrically connected to the first and second conductive members 38 and 42 to supply electrical energy to the illumination member 18 adjacent the energy harvesting module 16.

Figure 7:
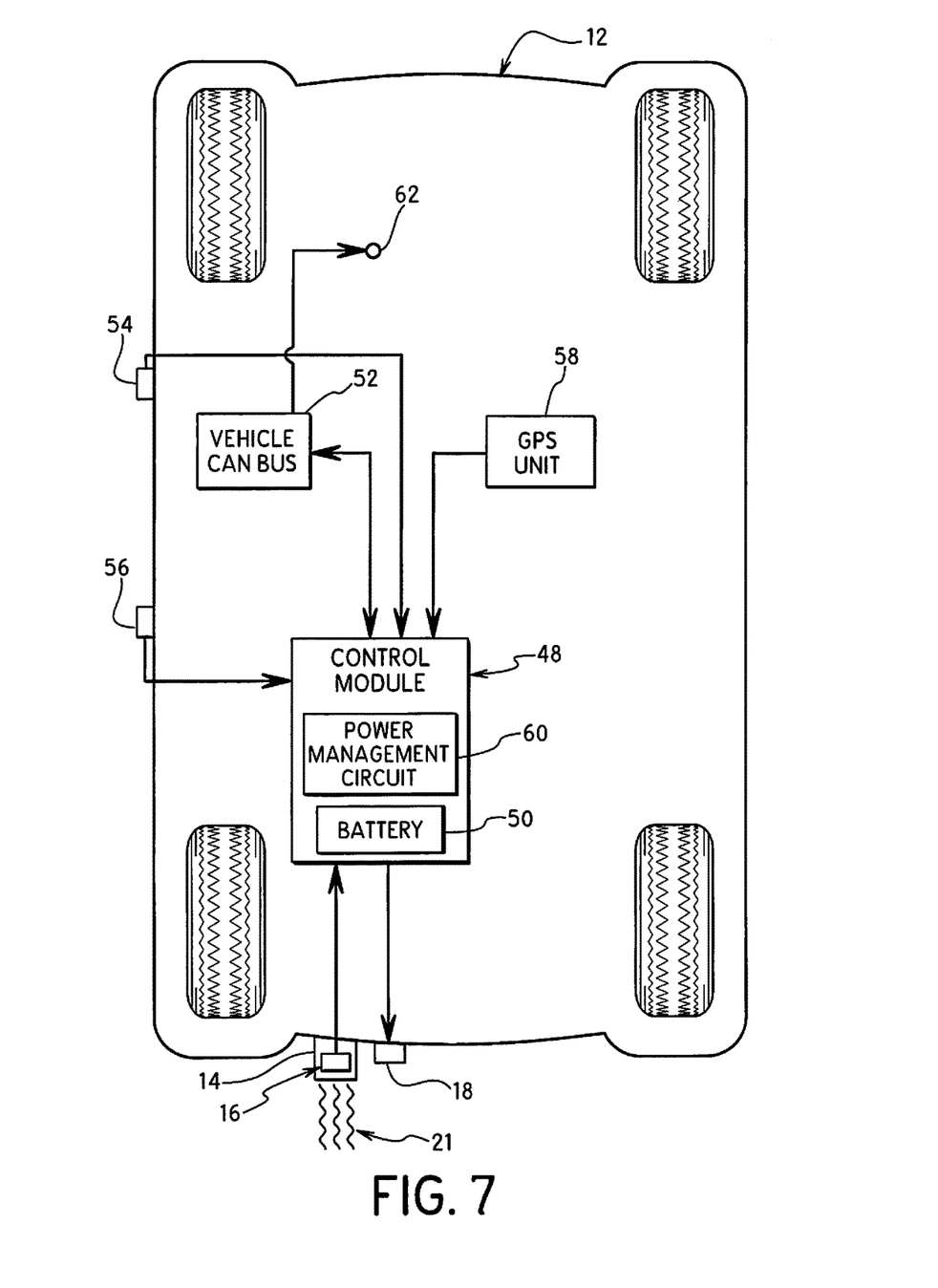
FIG. 7 is a schematic top view of a vehicle having an energy harvesting module in accordance with an exemplary embodiment of the present invention.

A control module 48 is electrically connected to the energy harvesting module 16, as shown in FIG. 7, and is configured to control the electrical energy supplied to the illumination member 18. The control module 48 can be integrally formed with the energy harvesting module 16 or formed separately therefrom. The control module 48 can include a battery 50 configured to store electrical energy generated by the energy harvesting module 16. The battery 50 can be any suitable battery, such as a 12 volt battery. The control module 48 can also include a power management circuit 60 to control charging of the battery 50 and to control the electrical energy supplied to the illumination member 18. The power management circuit 60 monitors the power level of the battery 50. Harvested energy is directed to the battery 50 to recharge the battery when the power management circuit 60 determines the power level has decreased below a predetermined level.

As shown in FIGS. 1-6, the energy harvesting module 16 and the illumination member 18 can be a fully integrated assembly such that the energy harvesting module 18 and the illumination member 18 can be easily installed as a stand-alone unit to an existing vehicle without requiring additional wiring or other structural modifications to the vehicle. Heat energy emitted from the exhaust pipe 14 of the vehicle 12 is captured with the energy harvesting device 20 of the energy harvesting module 16. The captured heat energy is converted to electrical energy with the energy harvesting device 20. The electrical energy is supplied to the illumination member 18 to illuminate the illumination member 18.

Figure 8:
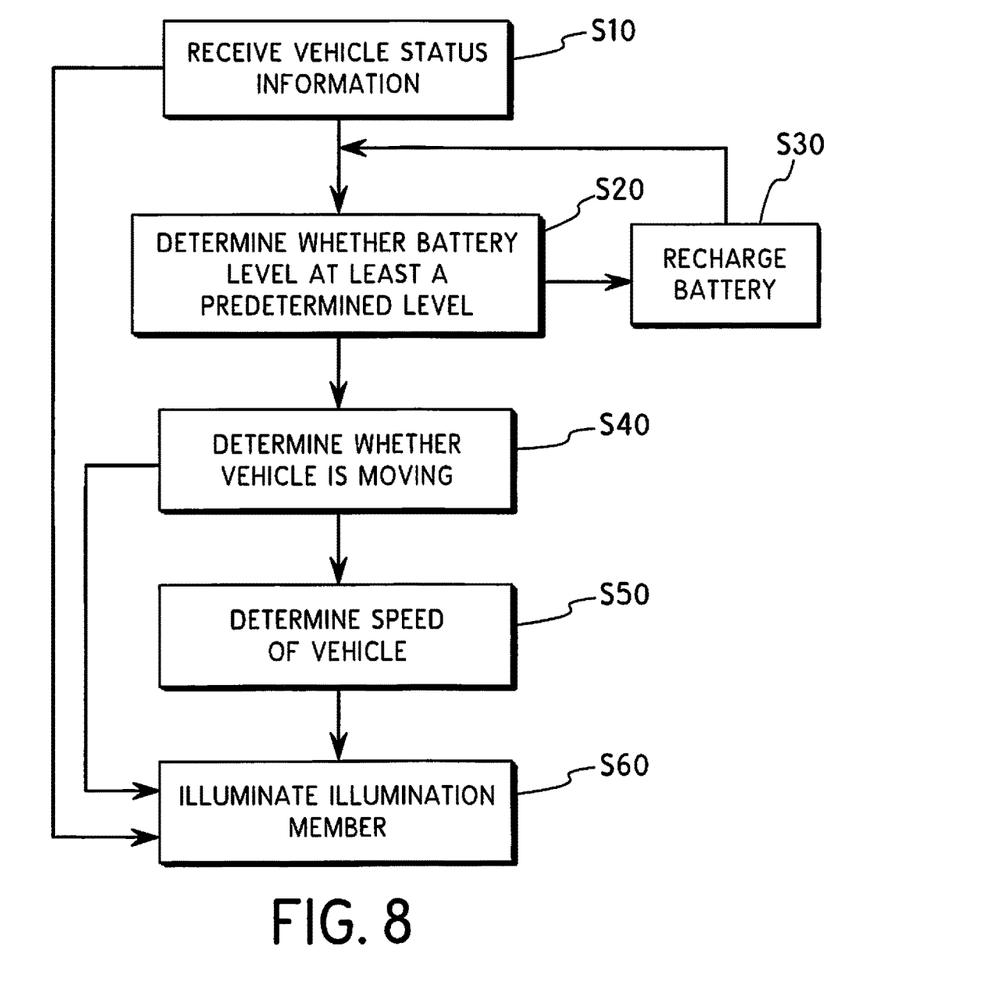
FIG. 8 is a flowchart illustrating a method of illuminating an illumination member with the energy harvesting module in accordance with an exemplary embodiment of the present invention.

In another exemplary embodiment of the present invention shown in FIGS. 7 and 8, the control module 48 can be configured to communicate with vehicle components to control the supply of electrical energy to the illumination member 18. The various inputs can be used by the control module 48, for example, to control when electrical energy is supplied to the illumination member 18, to control the intensity of the illumination of the illumination member 18, to control whether the illumination member 18 is illuminated in a solid or flashing manner, and which color of the illumination member 18 is illuminated.

A vehicle controller area network (CAN bus) 52 is connected to the control module 48. The CAN bus 52 can be electrically connected to the control module 48 or can be wirelessly connected thereto, such as through WiFi, to facilitate communication therebetween. Vehicle status information, such as whether the vehicle ignition is on or the speed of the vehicle, is transmitted from the CAN bus 52 to the control module 48.

An airflow sensor 54 can be electrically connected to the control module 48. The airflow sensor 54 is configured to detect movement or speed of the vehicle 12. The vehicle status information detected by the airflow sensor 54 is transmitted to the control module 48, as shown in FIG. 7.

A vibration sensor 56 can be connected to the control module 48. The vibration sensor 56 is configured to detect movement of the vehicle 12. The vehicle status information detected by the vibration sensor 56 is transmitted to the control module 48, as shown in FIG. 7.

A global navigation system (GPS) unit 58 can be electrically connected to the control module 48. The GPS unit 58 is configured to detect movement or speed of the vehicle 12. The vehicle status information sensed by the GPS unit 58 is transmitted to the control module 48, as shown in FIG. 7.

In another exemplary method shown in FIGS. 7 and 8, the control module 48 receives vehicle status information in step S10. The vehicle status information is supplied from a vehicle component, such as the CAN bus 52, the airflow sensor 54, the vibration sensor 56, or the GPS unit 58. The vehicle CAN bus 52 can supply information regarding whether the key is in the ignition or the current speed of the vehicle. The airflow sensor 54 can detect airflow past the sensor, thereby indicating movement of the vehicle. The airflow sensor 54 can also use the sensed airflow to detect the speed of the vehicle. The vibration sensor 54 can detect vehicle vibrations, thereby indicating operation of the vehicle. The GPS unit 58 can supply information regarding movement or speed of the vehicle. The input in step S10 also includes the converted electrical energy supplied from the energy harvesting module 16 to the control module 48. The input can be one of the above-noted inputs or any combination thereof. For example, the control module 48 can be configured to illuminate a plurality of different colors of the illumination member when a key is not received in the ignition with electrical energy being supplied from the battery 50. When the CAN bus 52 transmits a signal to the control module 48 that the key is received in the ignition, the control module 48 is configured to only illuminate one color, e.g., red.

In step S20, the power management circuit 60 determines whether the power level of the battery 50 is at least a predetermined level. For example, the power management circuit 60 determines whether the battery level is at least 10 volts. Alternatively, any suitable power level can be used.

When the power level of the battery 50 is below the predetermined level, the power management circuit recharges the battery 50 with electrical energy supplied from the energy harvesting module 16 in step S30.

In step S40, a determination is made by the control module 48 whether the vehicle is moving. Such determination can be used to distinguish between a state in which the vehicle is moving and a state in which the vehicle is idling, such as when stopped at a light. The determination in step S40 can be used to control the output voltage of the electrical energy supplied to the illumination member 18 to control an illumination intensity thereof in step S60. The determination can be used to control the color of the illumination member 18. For example, the illumination member 18 can be controlled to illuminate one color, such as red, when the engine is running and an alternative color when the vehicle 12 is stopped.

In step S50, the speed of the vehicle 12 is determined. The vehicle speed can be determined by the vehicle CAN bus 52, the airflow sensor 54, the GPS unit 58, or any other suitable device. The vehicle speed can be used, for example, to control the intensity of the illumination member 18 when illuminated in step S60. The intensity of the illumination member 18 can be varied depending on the speed of the vehicle, such that the illumination member is illuminated more brightly as the vehicle speed decreases.

In step S60, the control module 48 causes the illumination member 18 to be illuminated. The supply of the electrical energy to the illumination member 18 in step S60 is controlled by the vehicle status information transmitted to the control module 48 in the preceding steps (S10, S40 and S50).

An indicator light 62 can be electrically connected to the vehicle CAN bus 52 as shown in FIG. 7. The indicator light 62 is exposed to and visible from a passenger compartment of the vehicle 12. The indicator light 62 is electrically coupled to the energy harvesting module 16 such that the indicator light 62 is illuminated when the energy harvesting module 16 is harvesting energy.

The control module 48 can be further configured to illuminate the illumination member 18 as an alert. When a key fob for the vehicle 12 is activated to unlock a vehicle door, the vehicle CAN bus 52 sends a signal to the control module 48 (step S10), which causes the illumination member 18 to illuminate (step S60) as an alert that the vehicle door is being unlocked. The vehicle CAN bus 52 can also be configured to recognize the vehicle key fob when the key fob is within a predetermined distance. The vehicle CAN bus 52 sends a signal to the control module 48 (step S10) when the key fob is within the predetermined distance. The control module 48 causes the illumination member 18 to illuminate (step S60) responsive to the signal received from the vehicle CAN bus 52. The control module 48 can be configured such that the illumination alerts are a solid illumination or a flashing illumination of the illumination member 18. Additionally, the control module 48 can be configured such that the illumination of the illumination member 18 is a predetermined color corresponding to the alert being illuminated. The control module 48 can also be configured to control the duration of the illumination alert of the illumination member 18.

Accordingly, the illumination assembly 10 in accordance with the exemplary embodiments of the present invention harvests and utilizes heat energy emitted through the exhaust pipe 14 of the vehicle exhaust system to power an illumination member 18. The energy harvesting module 16 and the illumination member 18 can be a fully integrated, standalone assembly such that the energy harvesting module and the illumination member can be easily installed to an existing vehicle without requiring additional wiring or other modifications to the vehicle.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "forward", "rearward", "above", "downward", "vertical", "horizontal", "below" and "transverse" as well as any other similar directional terms refer to those directions of a vehicle including the energy harvesting device.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected exemplary embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the exemplary embodiments according to the present invention are provided for illustration only, and not for the purpose of limiting the invention as defined by the appended claims and their equivalents.

What is claimed is:

1. An illumination assembly for a vehicle, comprising:
an exhaust pipe;
an energy harvesting module disposed on an outer surface of the exhaust pipe and extending around an entire circumference of the exhaust pipe, the energy harvesting module including an energy harvesting device configured to capture heat and to convert the harvested heat to electrical energy;

an illumination member electrically connected to the energy harvesting module and configured to be illuminated by the electrical energy supplied from the energy harvesting device; and a control module configured to control the intensity of the illumination of the illumination member.

2. The illumination assembly according to claim 1, wherein
the energy harvesting module includes a storage device configured to store the electrical energy, the storage device being electrically connected to the energy harvesting device and to the illumination member.

3. The illumination assembly according to claim 1, wherein
the illumination member is disposed on the exhaust pipe.

4. The illumination assembly according to claim 3, wherein
the illumination member is disposed at an end edge of the exhaust pipe such that the illumination member emits light in a rearward vehicle direction.

5. The illumination assembly according to claim 1, wherein
the illumination member is connected to a rear bumper fascia of the vehicle.

6. The illumination assembly according to claim 1, wherein
the illumination member is a plurality of light emitting diodes.

7. The illumination assembly according to claim 1, wherein
the illumination member is a light pipe.

8. The illumination assembly according to claim 7, wherein
the light pipe is disposed about an entirety of a circumference of the exhaust pipe.

9. The illumination assembly according to claim 1, wherein
the energy harvesting module includes a heat shield disposed between the exhaust pipe and the energy harvesting device.

10. The illumination assembly according to claim 1, wherein
a sensor is connected to the control module, the sensor being configured to determine a status of the vehicle and to send the status to the control module.

11. The illumination assembly according to claim 1, wherein
the control module is connected to the vehicle bus to receive vehicle status information from the vehicle bus.

12. The illumination assembly according to claim 11, wherein
the vehicle status information includes whether a vehicle ignition is on, whether the vehicle is moving, or a speed of the vehicle.

13. The illumination assembly according to claim 1, wherein
the control module controls an output voltage of the electrical energy supplied to the illumination member to control an intensity of the illumination member.

14. A method of illuminating an illumination assembly of a vehicle, comprising:
capturing heat energy with an energy harvesting device disposed on an outer surface of an exhaust pipe of the vehicle, the energy harvesting device extending around an entire circumference of the exhaust pipe;
converting the captured heat energy to electrical energy with the energy harvesting device;
supplying the electrical energy to an illumination member electrically connected to the energy harvesting device to illuminate the illumination member; and
controlling the intensity of the illumination of the illumination member with a control module.

15. The method of illuminating an illumination assembly of a vehicle according to claim 14, further comprising
storing the electrical energy in a battery, the electrical energy supplied to the illumination member being supplied from the battery.

16. The method of illuminating an illumination assembly of a vehicle according to claim 14, further comprising
transmitting vehicle status information to the control module electrically connected to the energy harvesting device; and
controlling the supply of the electrical energy to the illumination member responsive to the vehicle status information.

17. The method of illuminating an illumination assembly of a vehicle according to claim 16, further comprising
sensing the vehicle status information with a sensor.

18. The method of illuminating an illumination assembly of a vehicle according to claim 17, wherein
the sensor senses air flow over the sensor or vibration of a vehicle component on which the sensor is disposed.

19. The method of illuminating an illumination assembly of a vehicle according to claim 16, further comprising
controlling an output voltage of the electrical energy supplied to the illumination member to control the illumination intensity of the illumination member.

20. The illumination assembly according to claim 1, wherein
the illumination intensity of the illumination member is configured to be varied in accordance with a speed of the vehicle.

* * * * *